(12) United States Patent
Sasi et al.

(10) Patent No.: US 11,799,487 B2
(45) Date of Patent: Oct. 24, 2023

(54) FRACTIONAL SAMPLING-RATE CONVERTER TO GENERATE OUTPUT SAMPLES AT A HIGHER RATE FROM INPUT SAMPLES

(71) Applicant: Ningbo Aura Semiconductor Co., Limited, Ningbo (CN)

(72) Inventors: Sandeep Sasi, Bangalore (IN); Raja Prabhu J, Bangalore (IN); Debasish Behera, Bangalore (IN); Akash Gupta, Bangalore (IN); Venkata Krishna Mohan Panchireddi, Bangalore (IN)

(73) Assignee: Ningbo Aura Semiconductor Co., Limited, Zhejiang (CN)

( * ) Notice: Subject to any disclaimer, the term of this patent is extended or adjusted under 35 U.S.C. 154(b) by 69 days.

(21) Appl. No.: 17/543,762

(22) Filed: Dec. 7, 2021

(65) Prior Publication Data
US 2022/0311445 A1    Sep. 29, 2022

(30) Foreign Application Priority Data

Mar. 23, 2021    (IN) .............................. 202141012418

(51) Int. Cl.
*H03L 7/093* (2006.01)
*H03L 7/081* (2006.01)
(Continued)

(52) U.S. Cl.
CPC .......... *H03L 7/093* (2013.01); *G06F 13/1673* (2013.01); *H03K 5/13* (2013.01);
(Continued)

(58) Field of Classification Search
CPC ..... H03L 7/093; H03L 7/081; H03L 2207/06; H03L 7/08; H03L 7/099; H03L 7/197;
(Continued)

(56) References Cited

U.S. PATENT DOCUMENTS

| | | | |
|---|---|---|---|
| 5,619,270 A | | 4/1997 | Demmer |
| 5,633,945 A | * | 5/1997 | Kamentsky ........ G01N 21/6428 435/808 |

(Continued)

FOREIGN PATENT DOCUMENTS

| | | |
|---|---|---|
| CN | 101464678 B | 6/2012 |
| EP | 1079758 A1 | 3/2001 |

OTHER PUBLICATIONS

Jaakko Ketola, Jouko Vankka and Kari Halonen, Synchronization of Fractional Interval Counter in Non-Integer Ratio Sample Rate Converters, Jun. 2003, pp. 89-92.
(Continued)

*Primary Examiner* — John W Poos
(74) *Attorney, Agent, or Firm* — IPHORIZONS PLLC; Narendra Reddy Thappeta

(57) ABSTRACT

A fractional sampling-rate converter includes a first-in first-out (FIFO) buffer, a write logic, a read logic and a fractional interpolator. The write logic is designed to write input data samples into the FIFO at a first rate. The fractional interpolator is coupled to receive the input data samples from the FIFO and is designed to generate corresponding interpolated data samples as an output of the fractional sampling-rate converter at a second rate. The read logic is designed to cause input data samples in the FIFO buffer to be transferred to the fractional interpolator. A ratio of the second rate and the first rate is a fractional number greater than one.

21 Claims, 10 Drawing Sheets

(51) Int. Cl.
*H03K 5/13* (2014.01)
*H03K 5/00* (2006.01)
*G06F 13/16* (2006.01)
*H03K 19/21* (2006.01)

(52) U.S. Cl.
CPC .............. *H03L 7/081* (2013.01); *H03K 19/21* (2013.01); *H03K 2005/00052* (2013.01)

(58) Field of Classification Search
CPC ...... G06F 13/1673; H03K 5/13; H03K 19/21; H03K 2005/00052
See application file for complete search history.

(56) References Cited

U.S. PATENT DOCUMENTS

| | | | |
|---|---|---|---|
| 7,061,409 B1 * | 6/2006 | Jantti ................ | H03H 17/0628 341/61 |
| 7,719,446 B2 | 5/2010 | Rosenthal et al. | |
| 8,264,388 B1 * | 9/2012 | Cohen .................... | H03L 7/093 331/10 |
| 2007/0008196 A1 | 1/2007 | Jensen | |

OTHER PUBLICATIONS

Marek Blok, Fractional Delay Filter Design for Sample Rate Conversion, Proceedings of the Federated Conference on Computer Science and Information Systems, Nov. 20, 2012, pp. 701-706, Poland.

Fractional Delay Filtering by Linear Interpolation, https://ccrma.stanford.edu/~jos/pasp/Fractional_Delay_Filtering_Linear.html, Downloaded circa Aug. 2, 2021, 1 page.

Rick Lyons, An Efficient Linear Interpolation Scheme, https://www.dsprelated.com/showarticle/1123.php, Dec. 27, 2017, 14 pages.

Fedor Merkelov and Yaroslav Kodess, Design and Implementation of Sampling Rate Converters for Conversions between Arbitrary Sampling Rates, Mar. 26, 2004, 83 Pages.

K. Rajalakshmi, et al., A fractional delay fir filter based on lag range interpolation of farrow structure, International Journal of Electrical and Electronics Engineering (IJEEE), vol. 1 Iss 4, 2012. 05 Pages.

Karthik Ramu Sangaiah, Variable Fractional Digital Delay Filter on Recongurable Hardware, Jun. 2012,79 Pages.

Djordje Babic, Jussi Vesma, and Markku Renfors, Decimation by Non-Integer Factor using CIC Filter and Linear Interpolation, Jul. 2001, 4 Pages.

Parinya Soontornwong and Sorawat Chivapreecha, Pascal-Interpolation-Based Noninteger Delay Filter and Low-Complexity Realization, Dec. 2015, pp. 1002-1012 vol. 24, No. 4.

Muhammad Abbas,On the Implementation of Integer and Non-Integer Sampling Rate Conversion, Jan. 2012, 85 Pages.

Practical and Non-integer Sampling, Multirate Sampling, Lec 10: Feb. 14, 2017, 73 Pages.

Delay Line Interpolation: Linear Interpolation, https://www.music.mcgill.ca/~gary/618/week1/node18.html, downloaded circa Sep. 1, 2021, 02 Pages.

* cited by examiner

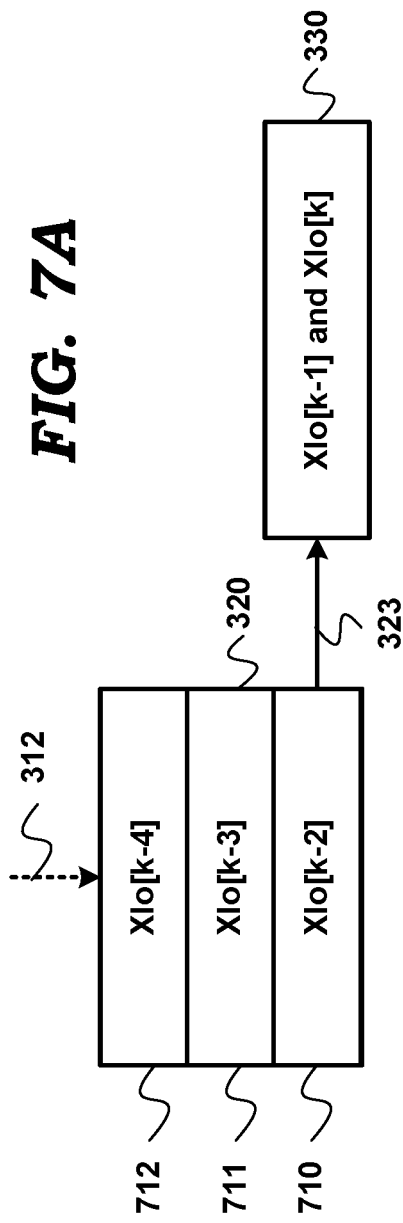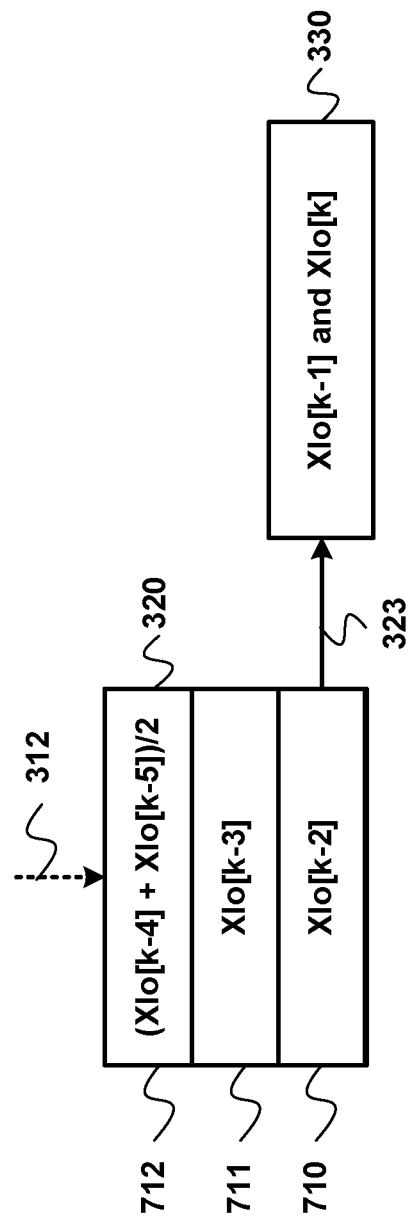

FRACTIONAL SAMPLING-RATE CONVERTER TO GENERATE OUTPUT SAMPLES AT A HIGHER RATE FROM INPUT SAMPLES

PRIORITY CLAIM

The instant patent application is related to and claims priority from the co-pending provisional India patent application entitled, "Method for Hardware Efficient Fractional Interpolator and Rate Converter Design for Multi Rate Signal Processing", Serial No.: 202141012418, Filed: 23 Mar. 2021, which is incorporated in its entirety herewith to the extent not inconsistent with the description herein.

BACKGROUND

Technical Field

Embodiments of the present disclosure relate generally to multi-rate signal processing, and more specifically to a fractional sampling rate converter to generate output samples at a higher rate from input samples.

Related Art

Sampling rate converters provide output samples at a different rate (output rate) compared to a rate (input rate) at which input samples are generated. Sampling rate converters find applications in digital signal processing environments such as audio codecs, image processing systems, phase-locked loops (PLL), etc., as is well known in the relevant arts.

There is often a need for such sampling rate converters to provide samples at an output rate which is higher than the input rate. The output rate may be required to be a (non-integer) fraction of the input rate, which effectively implies that the output rate is a higher fractional rate compared to the input rate.

Aspects of the present disclosure are directed to such fractional sampling rate converters that generate output samples at a higher rate from input samples.

BRIEF DESCRIPTION OF THE VIEWS OF DRAWINGS

Example embodiments of the present disclosure will be described with reference to the accompanying drawings briefly described below.

FIGS. 7A and 7B are diagrams illustrating ideal and overflow conditions respectively of a FIFO used in a fractional sampling-rate converter, in an embodiment of the present disclosure.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present disclosure, a fractional sampling-rate converter includes a first-in first-out (FIFO) buffer, a write logic, a read logic and a fractional interpolator. The write logic is designed to write input data samples into the FIFO at a first rate. The fractional interpolator is coupled to receive the input data samples from the FIFO and is designed to generate corresponding interpolated data samples as an output of the fractional sampling-rate converter at a second rate. The read logic is designed to cause input data samples in the FIFO buffer to be transferred to the fractional interpolator. A ratio of the second rate and the first rate is a fractional number greater than one.

In an embodiment, the write logic writes the input data samples into the FIFO buffer at a first constant frequency constituting the first rate (Flo), and the read logic causes the input data samples in the FIFO buffer to be transferred to the fractional interpolator at a variable frequency that on an average constitutes the first rate.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
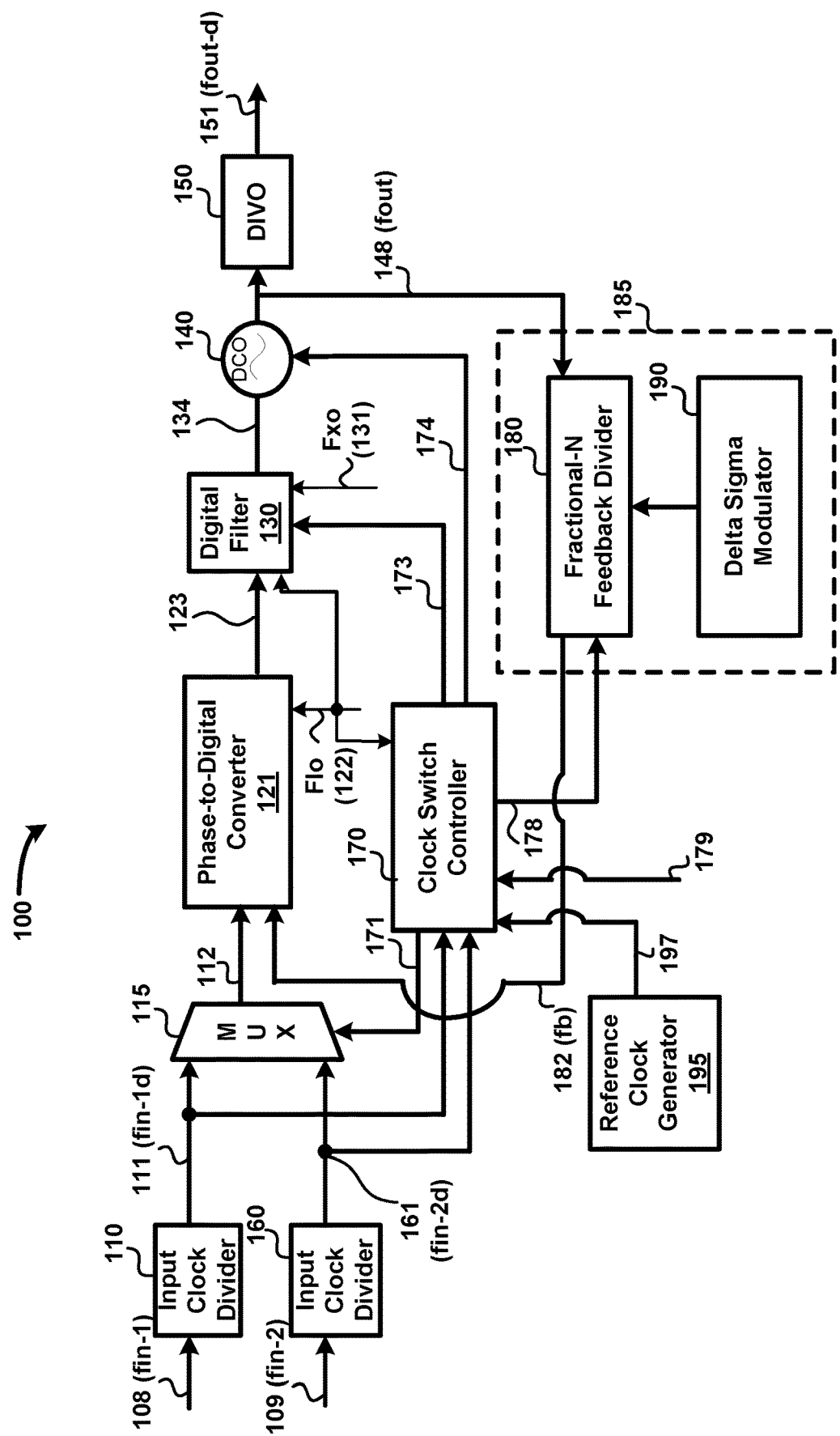
FIG. 1 is a block diagram of an example device in which several aspects of the present disclosure can be implemented.

FIG. 1 is a block diagram of an example device in which several aspects of the present disclosure can be implemented, and illustrates the implementation details of a phase locked loop (PLL). PLL 100 is shown containing input clock dividers 110 and 160, multiplexer (MUX) 115, phase-to-digital converter 121, digital filter block 130, digitally controlled oscillator (DCO) 140, output clock divider (DIVO) 150, feedback clock divider 185, clock switch controller 170 and reference clock generator 195. The specific blocks/components of PLL 100 are shown merely by way of illustration. Other embodiments of PLL 100 can be implemented with other blocks/components, as would be apparent to one skilled in the relevant arts upon reading the disclosure herein. For example, phase-to-digital converter 121 can be replaced by a time-to-digital converter (TDC), with corresponding changes in PLL 100. Further, while feedback clock divider 185 is shown as a combination of a fractional (frac-N) feedback divider 180 and a delta sigma modulator (DSM) 190, feedback clock divider 185 can also be implemented as an integer divider if fractional division is not needed.

Input clock divider 110 receives input clock fin-1 on path 108, divides fin-1 to generate a desired frequency, and provides the frequency-divided input clock as an output on path 111 (fin-1d). Input clock divider 160 receives input clock fin-2 on path 109, divides fin-2 to generate a desired frequency, and provides the frequency-divided input clock as an output on path 161 (fin-2d). The divide ratios used by dividers 110 and 160 have values such that the clocks fin-1d and fin-2d have the same frequency (possibly within some error margin).

MUX 115 receives fin-1d and fin-2d, and forwards one of fin-1d and fin-2d on path 112 as an output (MUX output/selected clock) based on the logic value of select signal 171.

Phase-to-digital converter 121 receives MUX output 112 and a feedback clock 182 (fb), generates an (internal) error signal whose value is proportional to the (present) phase difference between signals 112 and 182, and provides the error signal in digital form on path 123. Path 123 may represent one or multiple digital paths, each path for a corresponding bit of the digitized error signal. Phase-to-digital converter 121 receives a sampling clock Flo (122), and generates the digital error signals on path 123 at the rate Flo. Clock Flo (122) may be generated internally in PLL 100.

In alternative embodiments, component/block 121 can be implemented as a time-to-digital converter (TDC) in a known way, with corresponding modifications to the implementation of other blocks of PLL 100 as would be apparent to one skilled in the relevant arts. In general, component 121 operates as a phase detector, receives signals 112 and 182 (fb) and generates an error signal on path 123 in digital form, the digital error signal representing the phase error between the signals 112 and 182 (fb).

Digital filter block 130 provides data samples at a higher rate (Fxo) on path 134 based on input samples received on path 123 at the lower rate Flo. The output samples on path 134 may be generated based on interpolation. Digital filter block 130 also receives clocks Flo (122) and Fxo (131) to enable internal operation, as described below. Clock Fxo (131) may be generated internally in PLL 100. In an embodiment, digital filter block 130 may additionally operate as a digital low-pass filter and also further to introduce any desired delays to the received or generated data samples. The output samples on path 134 thus represent the low-pass filtered version of input samples on path 123.

Digitally controlled oscillator (DCO) 140 receives the samples on path 134. DCO 140 generates a periodic signal Fout (148) with a frequency that is determined by the magnitude of the current data sample received as input. DIVO 150 divides the frequency of fout by a desired number to generate fout-d (151).

Feedback clock divider 185 receives fout (148), and operates to divide the frequency of fout to a desired value. Generally, the divide ratio provided by feedback clock divider 185 enables fout to be generated at a multiple of the frequency of the selected one of input clocks fin-1 and fin-2. DSM 190 may be programmed by a user (via means not shown) to cause feedback clock divider 185 to use a fractional divide ratio. Depending on the specific divide ratio, DSM 190 generates a corresponding set of divide values (which are repeatedly provided to fractional-N feedback divider 180 to cause the divided clock fb (182) to have a frequency which, on an average, equals the desired fraction of the frequency of fout. An integer-only divider can also be used in place of component 185. Alternatively, DSM 190 can be programmed to cause fractional-N feedback divider 180 to divide fout by an integer divisor also.

Clock switch controller 170 receives clocks fin-1d and fin-2d. Clock switch controller 170 includes circuitry for determining whether the clocks are valid/functional or failed. In addition clock switch controller receives sampling clock Flo (122) to enable operations (including counting). In an embodiment, such circuitry is implemented as one or more counters, which counts the number of cycles (in a pre-determined time duration) of the received clocks to determine if the corresponding clock is functional. Clock switch controller 170 may require a non-zero length of time to determine if the currently used input clock is non-functional or not. In an embodiment of the present disclosure, clock switch controller 170 is designed to require a count of two cycles to declare whether the corresponding clock is functional or not.

Clock switch controller 170 may be pre-programmed to consider fin-1/fin-1d as the primary clock and fin-2/fin-2d as the secondary/redundant clock. Thus, by default (e.g., upon power-up of PLL 100), clock switch controller 170 may program the binary value of select signal 171 to cause MUX 115 to forward fin-1d on path 112. Clock switch controller 170 continues to check if fin-1d is functional. On determining that fin-1d has failed (is invalid/non-functional) or if an express command is received from an external device on path 179 (for example based on user input or from an external device) to switch to the secondary clock, clock switch controller 170 operates to achieve a hitless switchover to fin-2d by controlling components in digital filter block 130 and feedback clock divider 185. Clock switch controller 170 may require a non-zero length of time to react to the express command received on path 179, and thus switch to the secondary clock. Clock switch controller 170 may operate similarly to switch from using the secondary clock to using the primary clock if the secondary clock fails or if an express command is received on path 179 to switch back to the primary clock.

Reference clock generator 195 generates a (high-precision and high-stability) reference clock 197. In general, the ratio of the frequency of reference clock 197 to the (ideal/desired) frequency of fin-1d and fin-2d is fixed and known a priori (the ratio can be a fraction or an integer). Reference clock 197 is used for estimating the frequency error of (actual) frequency of fin-1d and/or fin-2d with respect to the ideal/desired frequency, and is used to correct for such error in the output of PLL 100. Clock switch controller 170 generates a reset signal RST-sync (178) to release feedback clock divider 185 from reset synchronously with respect to clock fin-2d (161). Clock switch controller 170 may be implemented in a known way.

As noted above, input data samples on path 123 provided to digital filter block 130 have a sampling-rate Flo which is lower than the sampling-rate rate Fxo of the output data on path 134. In the example of FIG. 1, DCO 140 is implemented as another PLL (embedded PLL) and operates at rate Fxo, i.e., the reference clock of the embedded PLL is clock Fxo and several other blocks of the embedded PLL also operate using Fxo. Several corrections (in the event of an input clock failure or switching) are applied in digital filter 130 and combined with various other corrections (not shown or described as not being relevant), and are provided as inputs to DCO 140 on path 134. Such inputs to DCO 140 also need to be at rate Fxo.

Thus, PLL 100 represents an example of a multi-rate device or system. The implementation details of digital filter block 130 in an embodiment of the present disclosure are provided next with reference to FIG. 2.

3. Digital Filter Block

Figure 2:
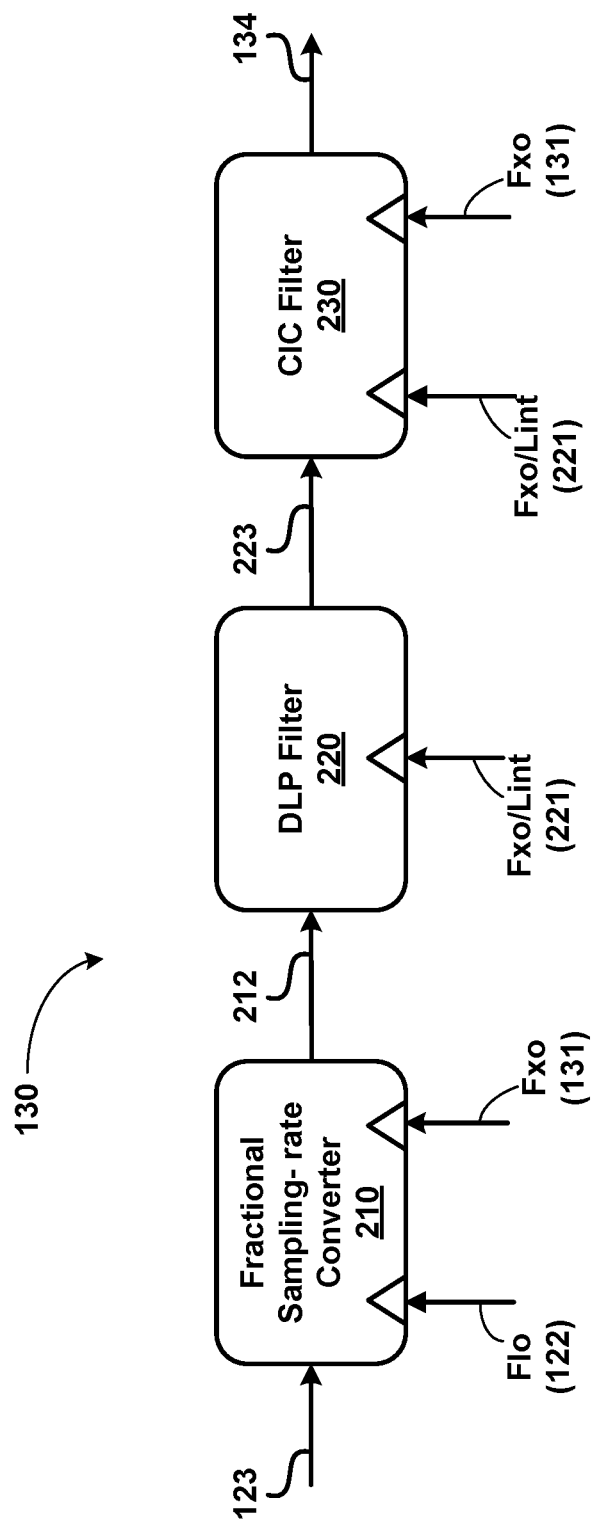
FIG. 2 is a block diagram of a low-pass filter block used in a PLL, in an embodiment of the present disclosure.

FIG. 2 is a block diagram illustrating the details of digital filter block 130 of FIG. 1 in an embodiment of the present disclosure. Digital filter block 130 is shown containing fractional sampling-rate converter 210, digital low-pass (DLP) filter 220 and cascaded integrator-comb (CIC) filter 230. In the interest of conciseness, the delay block noted above is not shown separately, and may be assumed to be provided within block 220. It is merely noted here that the delay provided by delay block enables PLL 100 to switch between input clocks without incurring transients in output clock fout (148) due to the non-zero time that may be required by clock switch controller 170 to switch PLL 100 to using a different input clock than the currently used input clock.

In FIG. 2, each of the data samples on paths 123, 212, 223 and 134 may be several bits wide, although the paths are shown as a single line.

Fractional sampling-rate converter 210 receives data samples on path 123 at a rate Flo, and operates to increase the sampling-rate by a fractional number (Llin) greater than one to generate output data samples on path 212 at a rate Fhi using interpolation. The ratio Llin of rates Fhi to Flo is a fractional number greater than 1. In an embodiment, the ratio is 1.66, although other fractional ratios are possible. Fractional sampling-rate converter 210 receives clocks Flo and Fxo. Rate Fhi equals rate Fxo/Lint, wherein Lint is an integer.

DLP filter 220 operates at a rate Fxo/Lint (based on a clock having frequency Fxo/Lint generated internally or generally within PLL 100). Accordingly, DLP filter 220 is shown as receiving a clock Fxo/Lint (221). DLP filter 220 contains one or more digital filters that operate (at Fxo/Lint) to provide low-pass filtering of the samples on path 212 (or equivalently) path 123. DLP filter 220 forwards the low-pass filtered samples on path 223 at a rate Fxo/Lint.

CIC filter 230 operates to increase the sampling-rate of the samples on path 223 by an integer value Lint to a rate Fxo, and is shown receiving clocks Fxo/Lint and Fxo. CIC filter 230 provides samples at a rate Fxo on path 134. DLP filter 220 and CIC filter 230 can be implemented in a known way. It may be appreciated that the overall sampling-rate increase in the samples on path 123 to those on path 134 is the product of the fractional sampling-rate factor (Llin) provided by fractional sampling-rate converter 210 and the integer sampling-rate factor (Lint) provided by CIC filter 230. The specific value of product L (i.e., Fxo/Flo) of Llin and Lint may be selected based on the specific design requirements of PLL 100.

The sequence of the blocks of FIG. 2 is shown merely for illustration. In alternative embodiments, the locations/sequence of the blocks can be altered with corresponding changes to the details of their design. For example, the locations of fractional sampling-rate converter 210 and DLP filter 220 can be interchanged, with DLP filter 220 connected directly to path 123, and converter 210 connected to path 212. In yet other embodiments, CIC filter 230 may not be implemented at all.

The implementation details and operation of fractional sampling-rate converter 210 as shown in FIG. 2 is provided next.

4. Fractional Sampling-Rate Converter

Figure 3A:
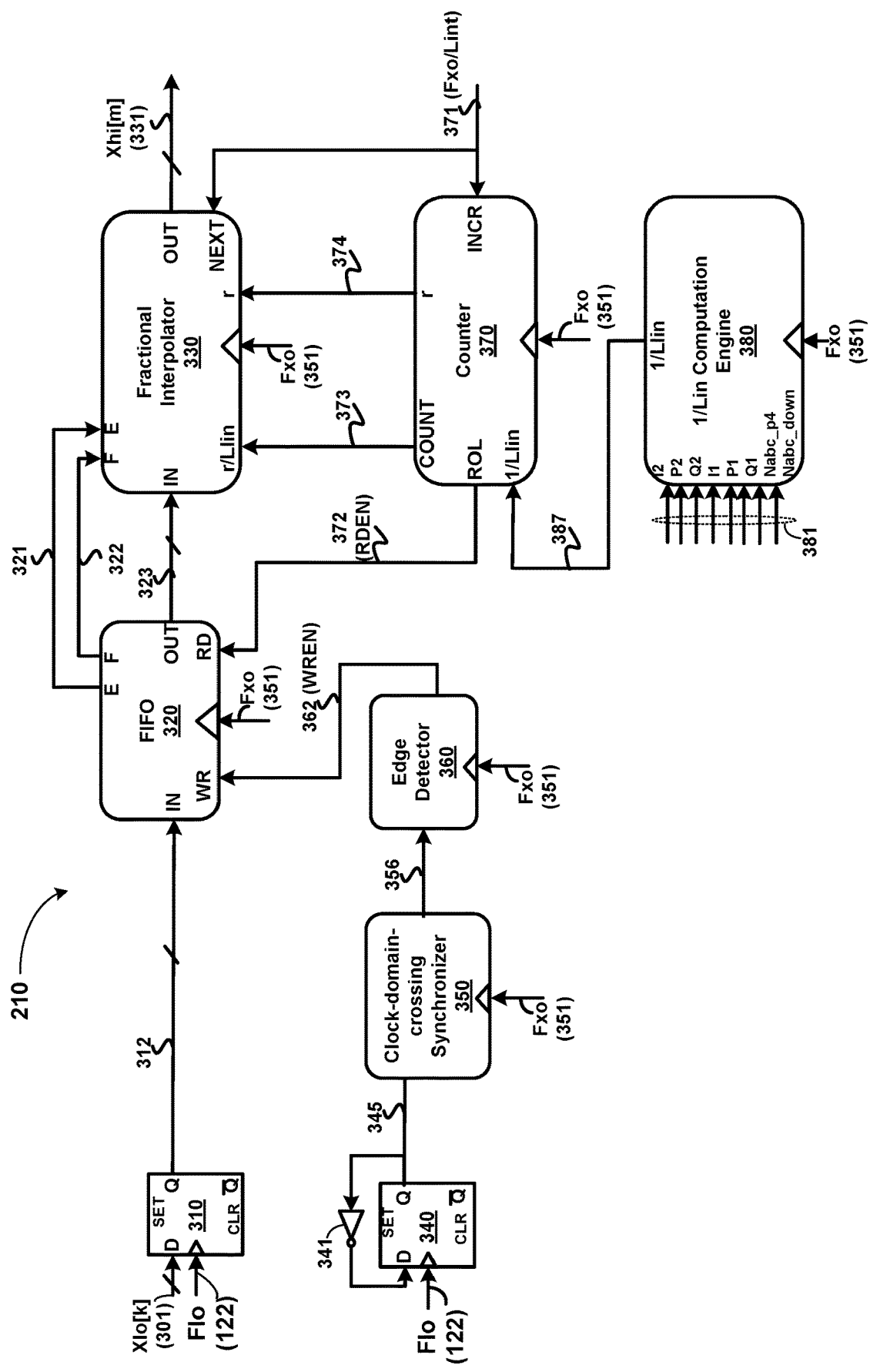
FIG. 3A is a block diagram of a fractional sampling-rate converter, in an embodiment of the present disclosure.

FIG. 3A is a block diagram of a fractional sampling-rate converter in an embodiment of the present disclosure. Fractional sampling-rate converter 210 is shown containing register 310, flip-flop 340, clock-domain-crossing synchronizer 350 (synchronizer 350), edge detector 360, first-in first-out buffer (FIFO) 320, fractional interpolator 330, counter 370 and 1/Llin computation engine 380. In FIG. 3A, paths that containing multiple bit lines are marked with a slash (/), and all contain the same number of bit lines. Register 310 and flip-flop 340 operate based on (synchronous with) clock Flo (122). The rest of the blocks of FIG. 3A operate based on (synchronous with) clock Fxo (351). The use of a higher-frequency clock Fxo (which equals Fhi*Lint) rather than Fhi simplifies the implementation and operation of these blocks. In the description below, it is assumed for ease of illustration and description that data samples 301 correspond to data samples 123 (of FIGS. 1 and 2), and interpolated samples 331 correspond to data samples 134 (of FIGS. 1 and 2).

Register 310 receives a multi-bit (N bits, where N can be for example 32) input data sample Xlo[k] on path 310, with k representing an index or sample number, and stores the sample at the active (e.g., rising) edge of clock Flo (122) applied to the clock terminal of register 310. The input sample is available at the output (Q) of the register till the next active edge of Flo, when the next input data sample is stored and made available at the output. The output (Q) is connected to input (IN) of FIFO 320 by path 312.

Flip-flop (FF) 340 and inverter 341 together operate to divide the frequency of clock Flo (122) applied at the clock terminal of FF 340 by two. The single-bit output (Q) of FF 340 is connected via inverter 341 to the D input of FF 340. The divided clock is provided via path 345 to the input of synchronizer 350.

Figure 3B:
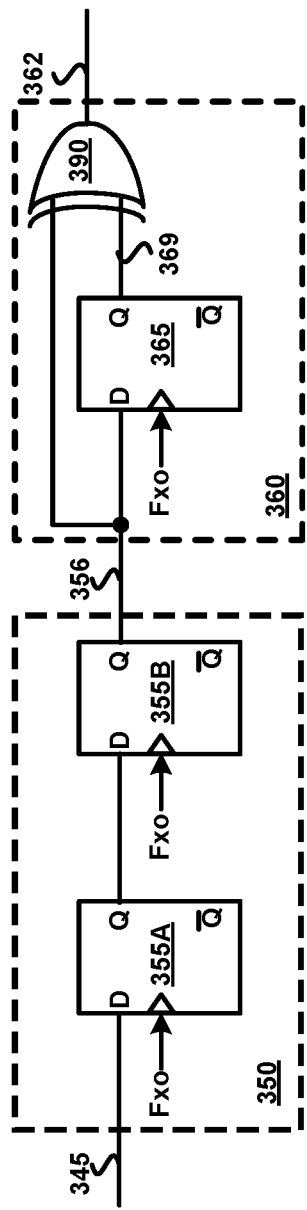
FIG. 3B is a block diagram depicting the implementation details of a synchronizer and edge detector used in a fractional sampling-rate converter, in an embodiment of the present disclosure.

Synchronizer 350 operates to minimize or eliminate the probability of metastability when the divided clock 345 crosses from domain of clock Flo to the domain of clock Fxo. Clocks Flo and Fxo are asynchronous with respect to each other, in addition to having different frequencies. As may be observed from FIG. 3A, blocks 310, and 340 operate in the Flo (122) domain, while the other blocks there operate in the Fxo (351) domain. Synchronizer 350 is shown in FIG. 3B implemented as a pair of flip-flops 355A and 355B connected in series, such that signal 345 passes through the two flip-flops, each clocked by Fxo, to be provided as synchronized divided clock on path 356. Although only a pair of serially connected flip-flops is shown as implementing synchronizer 350, more than two serially-connected flip-flops can be used for the synchronization operation depending on the frequency of Fxo, for example, when Fxo is very high, as is well known in the relevant arts. Synchronizer 350 provides the synchronized divided clock 356 as input to edge detector 360.

Referring again to FIG. 3A, Edge detector 360 receives clock Fxo (351), and operates to generate pulses at every edge of divided clock 356. The implementation of edge detector 360 in an embodiment is shown in FIG. 3B, in which edge detector 360 is implemented using a flip-flop 365 and an exclusive-OR (XOR) gate 390. FF 365 delays divided clock 356 by one cycle of Fxo (received on clock terminal of FF 365) and provides the delayed clock on path 369. XOR gate generates the result of the XOR operation on inputs 356 and 369, to generate pulses on output 362 at every clock edge of clock 356.

Figure 5:
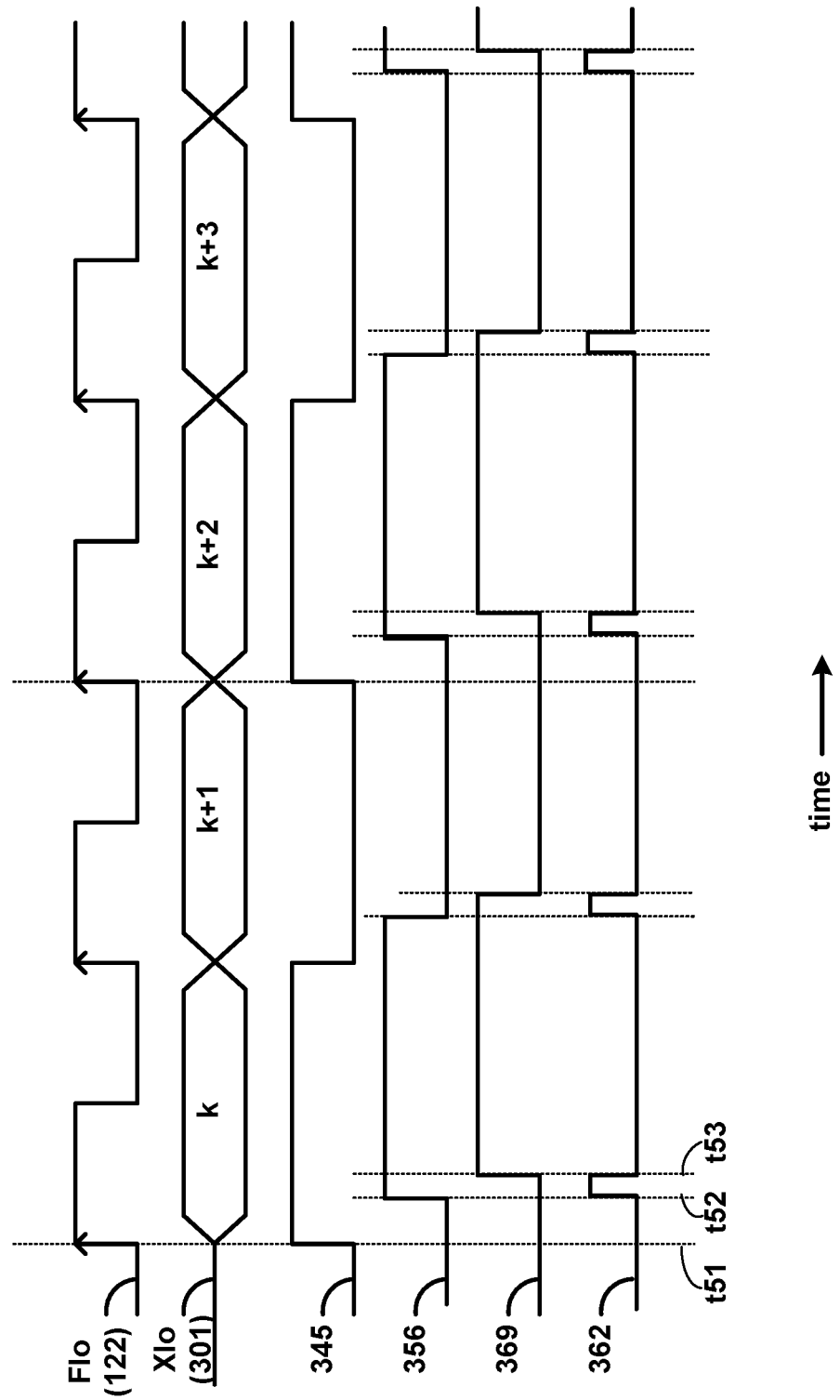
FIG. 5 is a timing diagram illustrating the signals at various nodes of a synchronizer and edge detector used in a fractional sampling-rate converter, in an embodiment of the present disclosure.

FIG. 5 is a timing diagram of illustrating the generation of pulses on path 362. A few cycles of clock Flo (122), input data samples Xlo (on path 301), divided clock 345, synchronized clock 356, delayed clock 369 and pulses 362 are shown there. Four input data samples Xlo[k], Xlo[k+1], Xlo[k+2] and Xlo[k+3] at a sampling rate Flo are shown in FIG. 5. Time interval t51-t52 equals two cycles of Fxo, and time interval t52-t53 equals one cycle of Fxo. Pulses on path 362 are also generated at rate Flo, are synchronous with Fxo, and are generated at, or corresponding to, each edge (rising and falling) of synchronized and divided clock 356, and therefore at, or corresponding to, each active (here rising) edge of Flo.

Referring once more to FIG. 3A, the pulses on path 362 are applied as write enable (WREN) signals to the write-enable terminal (WR) of FIFO 320. Thus, input data samples Xlo provided on path 312 are written in a synchronous manner (with respect to clock Fxo) at a rate Flo into FIFO. The combination of register 310, FF 340, synchronizer 350 and edge detector 360 may be viewed as a "write logic" that writes input data samples Xlo into FIFO at a constant frequency constituting a first rate (Flo), as may be observed from the timing diagram of FIG. 5. Specifically, the duration between the rising edges of the pulses is the same/constant, if we discount the synchronizer 350 uncertainty of one Fxo cycle (i.e., the duration between pulses can have an error equal to zero or one period of Fxo clock), and thus the frequency is said to be constant.

FIFO 320 is a synchronous FIFO, and buffers input data samples written into it via the IN input terminal, as described above. Counter 370, among other operations, generates read enable signals (applied at the RD terminal of FIFO 320) to cause the stored input data samples in FIFO 320 to be provided as output (via terminal OUT) at a rate that has variations, but which on an average equals rate Flo, as described below.

Figure 4A:
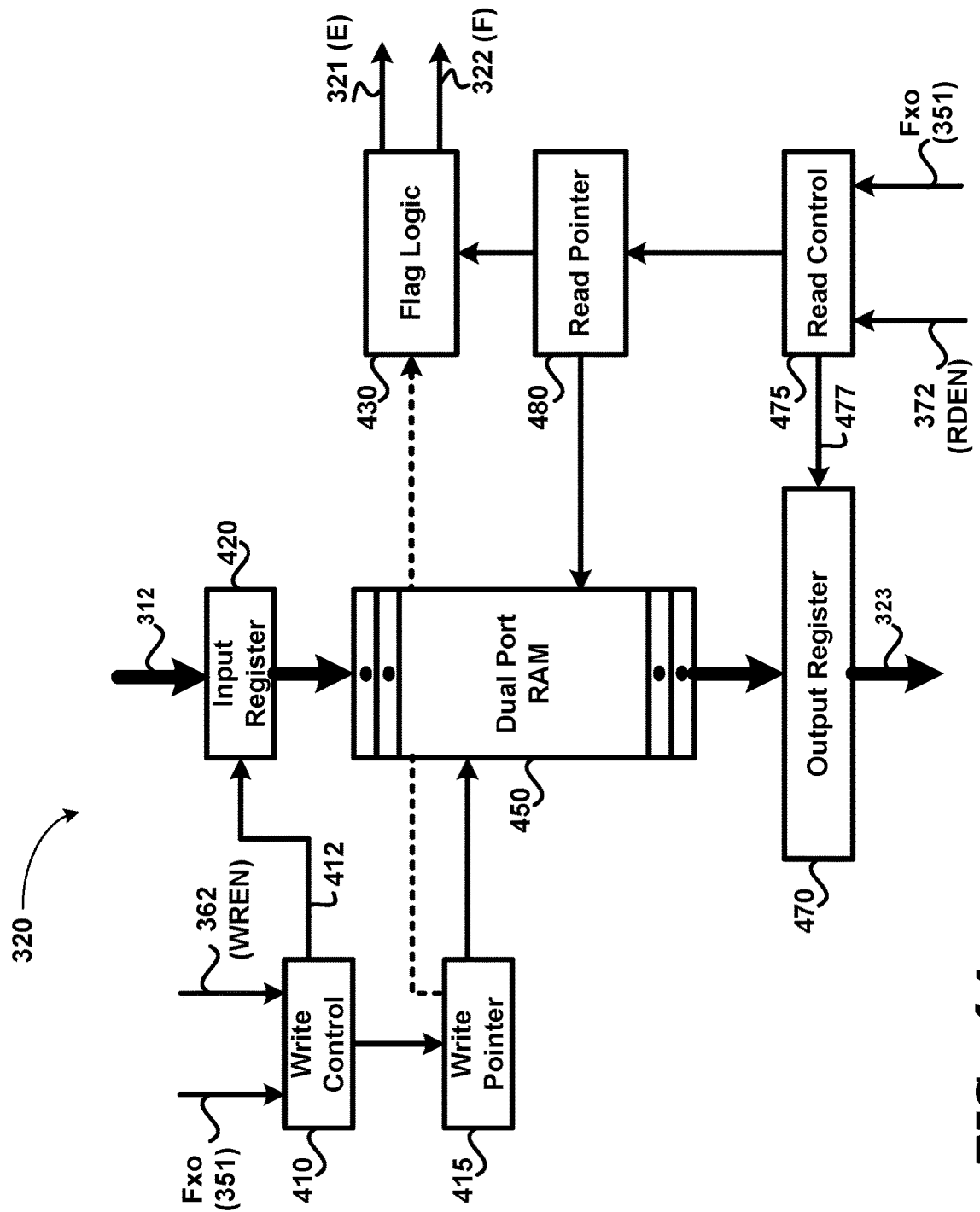
FIG. 4A is a block diagram illustrating relevant details of a FIFO, used in a fractional sampling-rate converter, in an embodiment of the present disclosure.

The internal details of FIFO 320 are illustrated in FIG. 4A, in which FIFO 320 is shown containing write control 410, write pointer 415, input register 420, flag logic 430, dual-port random access memory (DPRAM) 450, output register 470, read control 475 and read pointer 480. The specific details of synchronous FIFO 320 are shown merely to illustrate. Synchronous FIFO 320 may be implemented to contain more or fewer blocks, as would be well known in the relevant arts. Both writes to and reads from synchronous FIFO 320 are synchronized with respect to clock Fxo. FIFO 320 can be implemented in a known way and the internal details are only briefly described below.

DPRAM 450 represents a memory array. Writes to and reads from the memory array can be performed simultaneously. Input register 420 is connected to path 312 (IN terminal of FIFO 320 as shown in FIG. 3A) on which a data sample is provided by register 310. The data sample is stored in input register 420 on an active level of signal 412. Signal 412 is a pulse that is generated synchronous to Fxo when WREN 362 is active, i.e., pulses (as for example, in interval t52-t53 in FIG. 5). The data sample captured in input register 420 is moved/written to the appropriate memory cell based on the address currently contained in write pointer 415. Write pointer 415 is then incremented to the next address in the array or reset to the lowest address (address of the first cell in FIFO 320) if it is pointing to the highest memory address, provided the FIFO (or DPRAM 450) is not full. However, if the FIFO is full, the write pointer is not incremented and the write is not performed. In an embodiment of the present disclosure, DPRAM 450 is implemented using flip-flops in a known way.

Read pointer 480 contains the current address of the memory cell in DPRAM 450 to be read. Output register 470 receives, at an active level of signal 477, a stored data sample from the memory cell (in DPRAM 450) whose address is currently contained in read pointer 480. The data sample is available on path 323 (OUT terminal of FIFO 320 as shown in FIG. 3A). Signal 477 is a pulse that is generated synchronous to Fxo when RDEN 372 is active. RDEN 372 is generated (e.g., in the form of a pulse) by counter 370, as described below. After the read, read pointer 480 is incremented to the next address in the array or reset to the lowest address (address of the first cell in FIFO 320) if it is pointing to the highest memory address, provided the FIFO (or DPRAM 450) is not empty. However, if the FIFO is empty, the read pointer is not incremented and the data sample on path 323 will be invalid/non-deterministic.

Flag logic is connected to write pointer 415 and read pointer 480 and contains multiple flags indicating the status of FIFO 320 based on the addresses currently in write pointer 415 and read pointer 480. Only two flags 321(E) and 322 (F) are shown in FIG. 4A. Flag 321 is asserted (e.g., to binary 1) when FIFO 320 is empty, and flag 322 is asserted when FIFO 320 is full. Flags 321 and 322 are respectively connected to E (Empty) and F (Full) terminals of interpolator 330. Upon reset/power-up, read pointer 480 and write pointer 415 are initialized to the lowest cell address (zero). The flags are reset to the appropriate values.

It is noted here that although noted as a synchronous FIFO, FIFO 320 can be implemented in other embodiments as an asynchronous FIFO also, as would be apparent to one skilled in the relevant arts. In the asynchronous FIFO, the read and write pointers would operate in (separate/different) read and write clock domains. To detect conditions like FIFO full and FIFO empty, the read and write pointers must be compared by the read and write logic implemented within the asynchronous FIFO. One of the pointers needs to be transferred to the clock domain of the other pointer before performing any such comparisons. It may be appreciated that such transfer is not needed in synchronous FIFO 320. In general, it is noted here that a synchronous FIFO is usually simpler, smaller, faster and less power hungry than an asynchronous FIFO.

Continuing with reference to FIG. 3A, non-integer (fractional) interpolator 330 receives input data samples (having sampling-rate Flo) on path 323 as controlled by RDEN signal from terminal ROL of counter 370. Fractional interpolator 330 generates Llin interpolated data samples for each received input data sample, with Llin being a fraction greater than 1. Fractional interpolator 330 provides the interpolated data samples Xhi[m], 'm' being an index or sample number, at a rate Fhi on path 331. As noted above the ratio of the frequencies Fhi to Flo equals Llin, a fractional number greater than 1. An example value of Llin is 1.66.

The operation of counter 370 and fractional interpolator 330 in respectively causing input data samples to be read and in generating interpolated data samples at rate Fhi is briefly described next.

5. Fractional Interpolation

Figure 6:
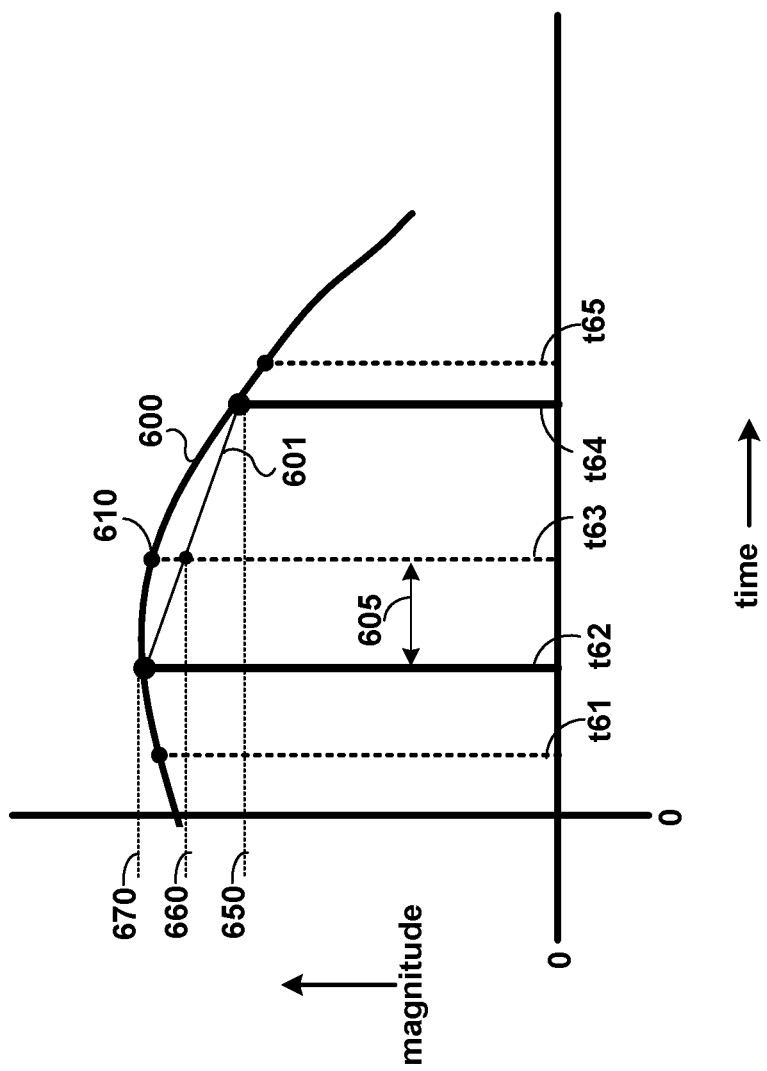
FIG. 6 is a diagram illustrating the manner in which linear interpolation is employed in a fractional interpolator according to the present disclosure.

In an embodiment of the present disclosure, fractional interpolator 330 employs linear interpolation. However, the techniques described herein can use other types (e.g., higher-order) interpolation techniques also. FIG. 6 is a diagram illustrating a few samples of Xlo and Xhi. Marker 600 indicates the envelope of the sampled input signal. Two samples of Xlo are used to obtain a linearly interpolated sample of Xhi. Time instants t61, t62, t63, t64 and t65 respectively correspond to (m−1)*Thi, (k−1)*Tlo, m*Thi, k*Tlo and (m+1)*Thi, wherein m and k are respectively the indices of interpolated data samples Xhi and input data samples Xlo, and Thi and Tlo are respectively the inverses of the sampling rates Fhi and Flo. At time instant 0, indices k and m are each 0. Markers 650 and 670 indicate the magnitudes Xlo[k] and Xlo[k−1] of input data samples at (k)*Tlo, and (k−1)*Tlo respectively. Marker 660 indicates the interpolated magnitude Xhi[m] for the interpolated (i.e., output) data sample at m*Thi generated by fractional interpolator 330 using the pair of input data samples Xlo[k] and Xlo[k−1] using a straight-line approximation. Marker 601 indicates the straight line formed by samples Xlo[k] and Xlo[k−1]. Marker 605 indicates a time interval equal to {m−(k−1)*Llin}*Thi, which is equal to r*Thi. For clarity, input data samples (k−1)*Tlo and k*Tlo are indicated by bold lines in FIG. 6, while interpolated (i.e., output) data samples m*Thi and (m+1)*Thi are indicated by dotted lines. In the description below, Xlo[k] represents the current input data sample, Xlo[k−1] represents the next input data sample, and so on. Similarly, Xhi[m] represents the current interpolated data sample, Xhi[m−1] represents the next interpolated data sample, and so on.

Using the two-point form of the equation of a straight line, $x_{hi}[m]$ can be approximated based on the following mathematical relationship:

$$\frac{xhi[m] - xlo[k-1]}{xlo[k] - xlo[k-1]} = \frac{(mThi(k-1)Tlo)}{kTlo - (k-1)Tlo} \quad \text{Equation 1}$$

$$= \frac{m - (k-1)Llin}{Llin}$$

$$= \frac{r}{Llin}$$

wherein,
m and k respectively are the time indices of samples Xhi and Xlo respectively, and
Llin is the fractional interpolation ratio Fhi/Flo.

Re-arranging Equation 1 provides the expression for xhi[m] as below:

$$xhi[m] = xlo[k-1] + \frac{r}{Llin}(xlo[k] - xlo[k-1]) \quad \text{Equation 2}$$

It may be appreciated that direct implementation of Equation 2 may pose several challenges. For example, discrete-time indices m and k would need to be tracked. Index m would need to be incremented for every cycle of output clock Fhi and k would need to be incremented for every cycle of input clock Flo. For every output sample Xhi, r i.e., {m−(k−1)*Llin} would need to be evaluated. Such implementation would not be practical because counters for generating indices m and k would need to be of infinite width. Further, input samples Xlo[k] being in clock domain Flo and interpolated samples Xhi[m] being in the clock domain Fhi, present corresponding difficulties in implementation.

Techniques of the present disclosure recognize the following relationships relating to indices m and k and variable r:

1. At every tick of Fhi, m≥(k−1)*Llin
2. The value of r=m−(k−1)*Llin always falls in the range [0, Llin)
3. If r+1<Llin, the next value of r is r+1
4. If r+1≥Llin, the next value of r is r+1−Llin
   (As used herein, '≥' represents a greater than or equal to condition,
   '<' represents a less than condition, and
   '*' represents a multiplication operation).

Based on the above observations, variable r is generated using a real counter. Counter 370 of FIG. 3A represents such a counter. Counter 370 receives clock Fhi (having a rate Fxo/Lint, and therefore synchronous with clock Fxo) on input terminal INCR'(371), and implements the following logic:

a. Initialize r to 0 upon reset/power-up of sampling rate converter 210.
b. At the next tick (active edge) of Fhi, increment r by 1. If the incremented value of r is greater than or equal to Llin (observation 4 above), set r to be r+1−Llin (Roll-over condition of counter 370).
c. Whenever, r+1≥Llin (i.e., counter 370 roll-over condition occurs), cause FIFO 320 to be read by pulsing RDEN 372 to provide the next sample of Xlo in FIFO 320 to fractional interpolator 330.
d. Repeat from b.

Counter 370 provides the current value of r to fractional interpolator 330 via output terminal named 'r' and path 374.

In an embodiment of the present disclosure, fractional interpolator 330 receives as an input (on input terminal marked r from output terminal also named r of counter 370) via path 374 the value of 'r' computed by counter 370 as noted above. Fractional interpolator 330 computes the 'current' interpolated sample Xhi[m] according to Equation 2. Fractional interpolator 330 provides the computed sample Xhi[m] on path 331. Fractional interpolator 330 internally contains one or more multiply units, divide units as well as addition/subtraction units to implement Equation 2.

Due to the fractional (non-integer) nature of Llin, the number of active edges of Fhi between two roll-over events of counter 370 is Llin on an average. In terms of actual numbers, however, fractional interpolator 330 generates either floor(Llin) or ceil(Llin) number of interpolated samples for every input data sample. Floor(Llin) and ceil (Llin) respectively represent the greatest integer not exceeding Llin and the smallest integer greater than or equal to Llin, respectively.

The samples Xlo[k] are read from FIFO 320 at a non-uniform rate (i.e., not a constant rate). Had a fixed-size buffer been used in place of FIFO 320, either a shortage of input data sample or a loss of input data sample could occur. The use of a FIFO (320 in this case) rather than a fixed-delay buffer results in a buffer that can grow or shrink, on demand. Having enough samples buffered in FIFO 320 already will handle both the synchronization uncertainty issue (due to the non-synchronous nature of clocks Flo and Fhi) and the condition of r rolling over in floor(Llin) Fhi cycles. Having enough headroom to accommodate more samples will handle the condition of r rolling over in ceil(Llin) Fhi cycles. In an embodiment, the ratio Fxo/Flo is greater than or equal to 6, and FIFO 320 has a depth of 5. At reset, FIFO 320 is initialized to contain three zero-valued input data samples, in case the condition of r (or equivalently counter 370)

rolling over in floor(Llin) number of Fhi cycles condition occurs before the first sample of Xlo gets written to FIFO 320.

Thus, fractional interpolator 330 generates, on an average, Llin interpolated samples on path 331 for every sample of the input Xlo. Therefore, fractional interpolator 330 consumes input samples at a rate Fhi/Llin 'on an average'. Since, Fhi/Llin equals Flo, counter 370 causes input data samples in FIFO 320 to be transferred (on path 323) to fractional interpolator 330 at a 'variable frequency' that on an average equals the rate Flo.

According to another aspect of the present disclosure and in an alternative embodiment, rather than fractional interpolator 330 computing r/Llin for generating each interpolated sample Xhi, counter 370 computes and provides the value r/Llin itself (rather than r only) at each active edge of Fhi (371) on terminal 'COUNT" and via path 373 to fractional interpolator 330 which receives the value on terminal r/Llin. Fractional interpolator 330 computes Xhi[m] according to equation 2. In the embodiment, counter 370 increments by 1/Llin at every active edge of Fhi. The roll-over condition of counter 370 correspondingly is when r/Llin evaluates to be greater than or equal to 1.0, in which case r/Llin is set to (r/Llin−1.0) The increment by 1/Llin and the roll-over condition of r/Llin>=1.0 can be derived from the relations noted above in points 2, 3 and 4.

Counter 370 receives the value 1/Llin from 1/Llin computation engine 380. In the embodiment, 1/Llin computation engine 380 is additionally implemented to compute 1/Llin, and provide 1/Llin to counter 370 on path 387. In the example context of PLL 100 of FIG. 1, engine 380 computes Llin according to the Equation below:

$$Llin=Fhi/Flo=(I2+P2/Q2)/(I1+P1/Q1)/Nadcp\_p4/Nadc\_down \quad \text{Equation 3}$$

Wherein, parameters I1, P1, Q1, I2, P2, Q2, Nadcp_p4 and Nadc_down are internal parameters (381) of PLL 100 (FIG. 1), and can be obtained/implemented in a known way.

In other contexts, however, Llin may be determined based on other considerations depending on the requirements of the context. Engine 380 receives each of the above-noted parameters, and computes 1/Llin based on Equation 3 above. The frequencies of clocks Fxo (from which Fhi is derived) and Flo may drift with respect to time. Hence, engine 380 computes 1/Llin from time to time (e.g., periodically). If the computed value differs from the current value of 1/Llin, engine 380 forwards the new value of 1/Llin to counter 370, which applies the new value in determining r/Llin (sent on path 373) when upon counter 370 rolling-over.

Due to round-off error in the register (within engine 380, and which in an embodiment is 32-bits wide) storing 1/Llin, as well as drift in one or both of clocks Flo and Fxo being very large, FIFO 320 can overflow or underflow before the new value of 1/Llin is computed and applied as noted above. According to another aspect of the present disclosure, such overflow or underflow of FIFO 320 is detected and corresponding corrective measures are taken by fractional sampling-rate converter 210. Accordingly, in the example embodiment of FIG. 3A, FIFO 320 provides the empty (E) and full (F) flags to fractional interpolator 320 on paths 321 and 322 respectively. The empty (E) flag being asserted is indicative of an underflow, while the full (F) flag being asserted is indicative of an overflow. Flag logic 430 (FIG. 4A) may employ the values in the write and read pointers in FIFO 320 as well as depth (size) of FIFO 320 in determining if an underflow or overflow condition has occurred.

As may be appreciated from the description above, fractional interpolator 330 always has the last two samples Xlo[k] and Xlo[k−1], assuming no overflow or underflow situation has occurred. When an overflow occurs, what should have been the next sample to be retrieved from FIFO 320 is overwritten by the next succeeding sample. FIGS. 7A and 7B respectively illustrate the ideal and overflow conditions respectively at the 'current' instant, and merely for illustration the depth of FIFO 320 is assumed to be 3. With respect to FIG. 7A, Xlo[k−1] and Xlo[k] are available inside fractional interpolator 330, and have been used to compute the latest interpolated sample Xhi[m]. Cells 710, 711 and 712 of FIFO 320 are shown as respectively containing samples Xlo[k−2], Xlo[k−3] and Xlo[k−4], and no overflow has occurred. For the computation of the next value of interpolated sample (and counter 370 has rolled over, fractional interpolator 330 obtains Xlo[k−2]. Xlo[k−1] becomes Xlo[k], and Xlo[k−2] becomes Xlo[k−1], and fractional interpolator uses the 'current' Xlo[k] and Xlo[k−1] to compute Xhi[m], which is now the current interpolated sample.

Figure 4B:
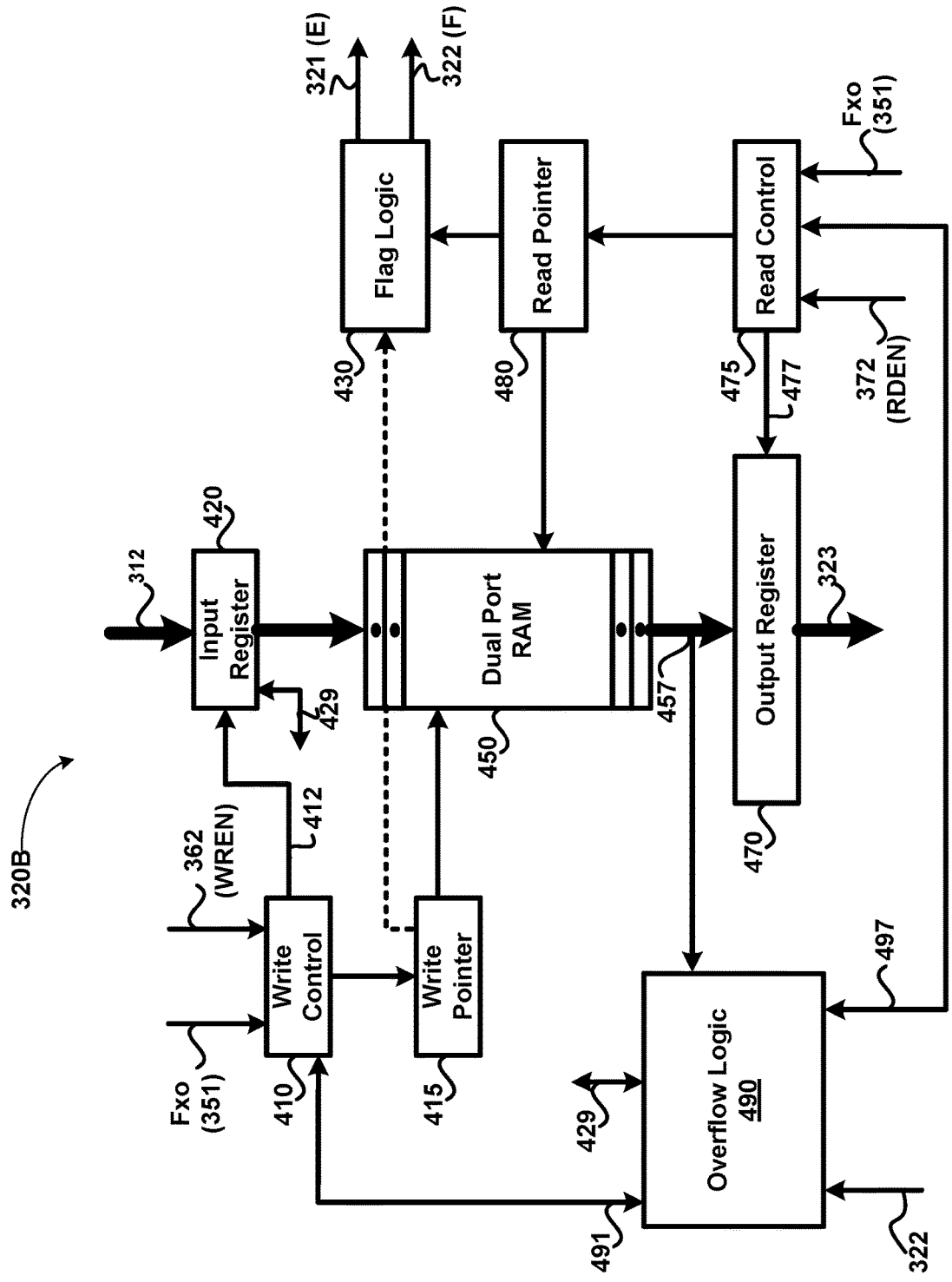
FIG. 4B is a block diagram illustrating relevant details of a FIFO used in a fractional sampling-rate converter to support overflow conditions, in an embodiment of the present disclosure.

However, if an overflow condition were to occur instead, additional logic (as shown in FIG. 4B) contained within FIFO 320, replaces the last sample (Xlo[k−4]) in the FIFO by the arithmetic mean of the next sample Xlo[k−5] (received on path 312, and which may, for example, be available in input register 420 of FIG. 4) and the last sample Xlo[k−4], as illustrated in FIG. 7B. That is:

$$Xlo[k-4]=(Xlo[k-4]+Xlo[k-5])/2 \quad \text{Equation 4}$$

Fractional interpolator 330 would eventually receive the sample value (Xlo[k−4]+Xlo[k−5])/2) and use the sample value in the process of computing interpolated samples as noted herein.

FIG. 4B illustrates the changes to FIFO buffer 320 of FIG. 4A to support the above-noted operations in response to an overflow condition. FIFO buffer 320B of FIG. 4B contains all the blocks of FIFO buffer 320 of FIG. 4A plus an additional block named overflow logic 490, along with the corresponding connections to/from overflow logic 490 and modifications to the corresponding blocks such as write control 410, read control 475, etc. It is noted that the specific details of FIFO buffer 320B are provided merely as an illustration, and there could be other ways of implementing the additional logic shown there. In operation, when overflow flag 322 indicates an overflow condition, overflow logic 490 signals write control 410 via bidirectional path 491 to signal back via path 491 when the next input data sample (Xlo[k−5]) has been written to input register 420. Upon receipt of indication via path 491 that the next input data sample has been written to input register 420, overflow logic 490 retrieves the data sample (Xlo[k−5]) in input register 420 via bidirectional path 429. Overflow logic 490 signals read control 475 via bidirectional path 497 to retrieve the last sample Xlo[k−4] (in Dual Port Ram 450). Read control 475 and read pointer 480 retrieve the last sample Xlo[k−4], which is made available at output 457 of DPRAM 450. Read control 475 signals via path 497 to overflow logic 490 that the last sample Xlo[k−4] is available at output 457 of DPRAM 450. Overflow logic 490 then reads the last sample Xlo[k−4] at output 457. Overflow logic block internally contains logic that generates the arithmetic mean of the next sample Xlo[k−5] and the last sample Xlo[k−4]. The above-noted operations may be performed concurrently or serially or a combination of the two. Overflow logic 490 then writes the computed arithmetic mean back to input register 420 via path 429, and signals write control 410 via path 491 to write the current content of input register 420 to the location of the last sample. The combination of write control 410 and write pointer 415 perform the write of the arithmetic mean to the location of the last sample.

Figure 8:
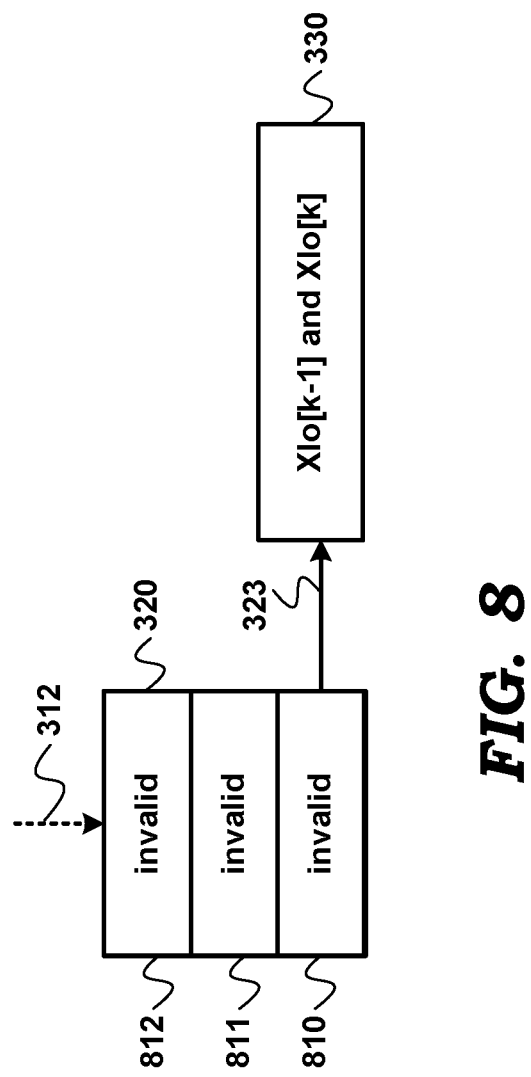
FIG. 8 is a diagram illustrating an underflow condition of a FIFO used in a fractional sampling-rate converter, in an embodiment of the present disclosure.

When an underflow occurs, FIFO 320 does not contain any valid samples, as shown in FIG. 8. Cells 810, 811, 812, as well as other cells of the FIFO contain invalid data. Fractional interpolator 330 'currently' contains Xlo[k−1] and Xlo[k]. Since there is no valid Xlo[k−2] in FIFO 320, fractional interpolator computes Xlo[k−2] as follows:

$$Xlo[k-2]=(2*Xlo[k])-Xlo[k-1] \qquad \text{Equation 5}$$

Xlo[k−1] becomes Xlo[k], and the computed Xlo[k−2] becomes Xlo[k−1], and fractional interpolator uses the 'current' Xlo[k] and Xlo[k−1] to compute Xhi[m].

It may be observed that from Equations 4 and 5 that fractional interpolator applies a linear technique to obtain the correct value of the next input sample to be used in both overflow and underflow conditions.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 2, 3A, 3B, 4A and 4B, although terminals/nodes/blocks are shown with direct connections to (i.e., "connected to") various other terminals/nodes/blocks, it should be appreciated that additional components/blocks (as suited for the specific environment) may also be present in the path, and accordingly the connections may be viewed as being "electrically coupled" to the same connected terminals//nodes/blocks.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A fractional sampling-rate converter comprising:
a first-in first-out (FIFO) buffer;
a write logic to write input data samples into said FIFO buffer at a first rate;
a fractional interpolator coupled to receive said input data samples from said FIFO buffer, said fractional interpolator to generate corresponding interpolated data samples as an output of said fractional sampling-rate converter at a second rate (Fhi); and
a read logic to cause input data samples in said FIFO buffer to be transferred to said fractional interpolator, wherein a ratio of said second rate and said first rate is a fractional number greater than one,
wherein said fractional interpolator is designed to compute a current interpolated sample according to the equation:

$$xhi[m]=xlo[k-1]+r/Llin(xlo[k]-xlo[k-1])$$

wherein,
Xhi[m] represents the current interpolated data sample,
Xlo[k] and Xlo[k−1] represent input data samples used to compute said current interpolated sample, Llin represents said ratio of said second rate and said first rate, and
'r' equals the expression {m−(k−1)*Llin}, wherein m and k are sample indices of the interpolated samples and the input data samples,
said fractional sampling rate converter further comprising a real counter clocked by a high-frequency clock (Fxo) having a frequency equal to (Fhi*Lint), wherein Lint is an integer and Fhi is a frequency of an intermediate clock, said real counter to compute the value of 'r' to be used by said fractional interpolator for obtaining each interpolated data sample including said current interpolated data sample, said real counter to forward to said fractional interpolator said value of 'r', said real counter also designed to operate as said read logic.

2. A fractional sampling-rate converter comprising:
a first-in first-out (FIFO) buffer;
a write logic to write input data samples into said FIFO buffer at a first rate;
a fractional interpolator coupled to receive said input data samples from said FIFO buffer, said fractional interpolator to generate corresponding interpolated data samples as an output of said fractional sampling-rate converter at a second rate (Fhi); and
a read logic to cause input data samples in said FIFO buffer to be transferred to said fractional interpolator, wherein a ratio of said second rate and said first rate is a fractional number greater than one, and
wherein said write logic writes said input data samples into said FIFO buffer at a first constant frequency constituting said first rate (Flo), and
wherein said read logic is designed to cause said input data samples in said FIFO buffer to be transferred to said fractional interpolator at a variable frequency that on an average constitutes said first rate.

3. The fractional sampling-rate converter of claim 2, wherein said fractional interpolator employs linear interpolation to generate said interpolated samples from said input data samples.

4. The fractional sampling-rate converter of claim 3, wherein said write logic comprises:
a register to receive each one of a plurality of input data samples at said first rate from a source, said register to store said input data samples at corresponding active edges of a low-frequency clock (Flo) having a frequency equal to said first rate, wherein a stored input data sample is available at an output of said register for a duration of one cycle of said low-frequency clock, said output of said register being coupled to an input data port of said FIFO buffer;
a flip-flop in a divide-by-2 configuration clocked by said low-frequency clock, an output of said flip-flop designed to toggle at every active edge of said low-frequency clock;
a clock-domain-crossing synchronizer having an input coupled to said output of said flip-flop, said clock-domain-crossing synchronizer to receive a high-frequency clock (Fxo) having a frequency equal to (Fhi*Lint), wherein Lint is an integer, and to store said output of said flip-flop at active edges of said high-frequency clock (Fxo), wherein the stored output of said flip-flop is available at a second output of said clock-domain-crossing synchronizer as a synchronized signal; and
an edge detector coupled to receive said synchronized signal, said edge detector to generate, at a third output of said edge detector, pulses at a rate equal to said first rate from said synchronized signal, wherein said third output is coupled to a write-enable terminal of said FIFO buffer, thereby causing input data samples to be written into said FIFO buffer at said first rate synchronous with said high-frequency clock.

5. The fractional sampling-rate converter of claim 4, wherein said edge detector comprises:

a delay element coupled to said second output, said delay element to delay said synchronized signal by a duration equal to one clock period of said high-frequency clock, and to generate a delayed synchronized signal at a fourth output of said delay element; and an exclusive-OR (XOR) gate coupled to receive each of said synchronized signal and said delayed synchronized signal, and to generate said pulses as a result of an XOR operation on said synchronized signal and said delayed synchronized signal.

6. The fractional sampling-rate converter of claim 4, wherein said FIFO buffer is a synchronous FIFO buffer and operates based on said high-frequency clock.

7. The fractional sampling rate converter of claim 6, wherein said fractional interpolator is designed to compute a current interpolated sample according to the equation:

$$xhi[m] = xlo[k-1] + \frac{r}{Llin}(xlo[k] - xlo[k-1])$$

wherein,

Xhi[m] represents the current interpolated data sample,

Xlo[k] and Xlo[k−1] represent input data samples used to compute said current interpolated sample, Llin represents said ratio of said second rate and said first rate, and 'r' equals the expression {m−(k−1)*Llin}, wherein m and k are sample indices of the interpolated samples and the input data samples, said fractional sampling rate converter further comprising a real counter clocked by said high-frequency clock, said real counter to compute the value of 'r' to be used by said fractional interpolator for obtaining each interpolated data sample including said current interpolated data sample, said real counter to forward to said fractional interpolator said value of 'r', said real counter also designed to operate as said read logic, wherein said real counter is designed to:

initialize r to zero upon reset of said fractional sampling-rate converter;

increment r by one at said second rate based on active edges of an intermediate frequency clock having a rate equal to Fhi, wherein said intermediate frequency clock is derived from and synchronous with said high-frequency clock (Fxo); and if the incremented value of r is greater than or equal to Llin, then set r to equal (r−Llin), and cause a next data sample in said FIFO buffer to be transferred to said fractional interpolator.

8. The fractional sampling rate converter of claim 6, wherein said fractional interpolator is designed to compute a current interpolated sample according to the equation:

$$xhi[m] = xlo[k-1] + \frac{r}{Llin}(xlo[k] - xlo[k-1])$$

wherein,

Xhi[m] represents the current interpolated data sample,

Xlo[k] and Xlo[k−1] represent input data samples used to compute said current interpolated sample, Llin represents said ratio of said second rate and said first rate, and 'r' equals the expression {m−(k−1)*Llin}, wherein m and k are sample indices of the interpolated samples and the input data samples, said fractional sampling rate converter further comprising a real counter clocked by said high-frequency clock, said real counter to compute the value of 'r/Llin' to be used by said fractional interpolator for obtaining each interpolated data sample including said current interpolated data sample, said real counter to forward to said fractional interpolator said value of 'r/Llin', said real counter also designed to operate as said read logic, wherein said real counter is designed to:

initialize r/Llin to zero upon reset of said fractional sampling-rate converter;

increment r/Llin by 1/Llin at said second rate; and if the incremented value of r/Llin is greater than or equal to 1.0, then set said incremented value to equal (r/Llin−1.0), and cause a next data sample in said FIFO buffer to be transferred to said fractional interpolator, wherein said setting represents an occurrence of a roll-over condition.

9. The fractional sampling rate converter of claim 8, further comprising:

a computation engine for computation of the value 1/Llin, said computation engine to provide said value 1/Llin to said real counter.

10. The fractional sampling rate converter of claim 9, wherein said computation engine updates said value 1/Llin from time to time to compensate for drifts in frequencies of said high-frequency clock and said low-frequency clock, wherein said real counter applies the updated value of 1/Llin upon occurrence of said roll-over condition.

11. The fractional sampling rate converter of claim 8, wherein upon occurrence of an overflow condition in said FIFO buffer, logic in said FIFO buffer is designed replace the last sample in said FIFO buffer by the arithmetic mean of a next input data sample received from said write logic and said last sample.

12. The fractional sampling rate converter of claim 11, wherein upon occurrence of an underflow condition, said fractional interpolator is designed to compute a next input data sample Xlo[k−2] to be used in computation of the next interpolated sample according to the Equation:

$$Xlo[k-2]=(2*Xlo[k])-Xlo[k-1],$$

wherein,

Xlo[k] and Xlo[k−1] are the last two samples currently available in said fractional interpolator.

13. A phase locked loop (PLL) comprising:

a multiplexer (MUX) coupled to receive a first clock and a second clock, said MUX to forward said first clock as a selected clock if a select signal has a first value, said MUX to forward said second clock as said selected clock if said select signal has a second value;

a phase detector coupled to receive said selected clock and a feedback clock, said phase detector to generate an error signal in the form of a stream of error data samples representing a phase difference between said selected clock and said feedback clock;

a digital filter block to generate a stream of filtered error data samples by filtering said error data samples;

an oscillator coupled to receive said filtered error data samples and to generate an output clock, wherein a frequency of said output clock is determined by a magnitude of said filtered error data samples; and a feedback divider generating each of successive cycles of said feedback clock on counting of a pre-determined number of cycles of said output clock, wherein said filtered error data samples are at a higher rate compared with that of said error data samples, wherein said digital filter block comprises a digital low-pass filter and a fractional sampling-rate converter, said fractional sampling-rate converter to receive said error data samples as input data samples, said fractional sampling-rate converter to generate interpolated data samples from said input data samples by interpolation and to provide said interpolated data samples to said digital low-pass filter, said digital low-pass filter to low-pass filter said interpolated data samples, and to provide filtered interpolated data samples as said filtered error data samples wherein said fractional sampling-rate converter comprises:
a first-in first-out (FIFO) buffer;
a write logic to write said error input data samples into said FIFO buffer at a first rate;
a fractional interpolator coupled to receive said input data samples from said FIFO buffer, said fractional interpolator to generate corresponding interpolated data samples as an output of said fractional sampling-rate converter at a second rate (Fhi); and
a read logic to cause input data samples in said FIFO buffer to be transferred to said fractional interpolator, wherein a ratio of said second rate and said first rate is a fractional number greater than one.

14. The PLL of claim 13, wherein said write logic writes said input data samples into said FIFO buffer at a first constant frequency constituting said first rate (Flo), and
wherein said read logic is designed to cause said input data samples in said FIFO buffer to be transferred to said fractional interpolator at a variable frequency that on an average constitutes said first rate.

15. The PLL of claim 14, wherein said fractional interpolator employs linear interpolation to generate said interpolated samples from said input data samples.

16. The PLL of claim 15, wherein said write logic comprises:
a register to receive each one of a plurality of input data samples at said first rate from a source, said register to store said input data samples at corresponding active edges of a low-frequency clock (Flo) having a frequency equal to said first rate, wherein a stored input data sample is available at an output of said register for a duration of one cycle of said low-frequency clock, said output of said register being coupled to an input data port of said FIFO buffer;
a flip-flop in a divide-by-2 configuration clocked by said low-frequency clock, an output of said flip-flop designed to toggle at every active edge of said low-frequency clock;
a clock-domain-crossing synchronizer having an input coupled to said output of said flip-flop, said clock-domain-crossing synchronizer to receive a high-frequency clock (Fxo) having a frequency equal to (Fhi*Lint), wherein Lint is an integer, and to store said output of said flip-flop at active edges of said high-frequency clock (Fxo), wherein the stored output of said flip-flop is available at a second output of said clock-domain-crossing synchronizer as a synchronized signal; and
an edge detector coupled to receive said synchronized signal, said edge detector to generate, at a third output of said edge detector, pulses at a rate equal to said first rate from said synchronized signal,
wherein said third output is coupled to a write-enable terminal of said FIFO buffer, thereby causing input data samples to be written into said FIFO buffer at said first rate synchronous with said high-frequency clock.

17. The PLL of claim 16, wherein said edge detector comprises:
a delay element coupled to said second output, said delay element to delay said synchronized signal by a duration equal to one clock period of said high-frequency clock, and to generate a delayed synchronized signal at a fourth output of said delay element; and
an exclusive-OR (XOR) gate coupled to receive each of said synchronized signal and said delayed synchronized signal, and to generate said pulses as a result of an XOR operation on said synchronized signal and said delayed synchronized signal.

18. The PLL of claim 16, wherein said FIFO buffer is a synchronous FIFO buffer and operates based on said high-frequency clock.

19. The PLL of claim 18, wherein said fractional interpolator is designed to compute a current interpolated sample according to the equation:

$$xhi[m] = xlo[k-1] + \frac{r}{Llin}(xlo[k] - xlo[k-1])$$

wherein,
Xhi[m] represents the current interpolated data sample,
Xlo[k] and Xlo[k−1] represent input data samples used to compute said current interpolated sample,
Llin represents said ratio of said second rate and said first rate, and
'r' equals the expression {m−(k−1)*Llin}, wherein m and k are sample indices of the interpolated samples and the input data samples,
said fractional sampling rate converter further comprising a real counter clocked by said high-frequency clock, said real counter to compute the value of 'r/Llin' to be used by said fractional interpolator for obtaining each interpolated data sample including said current interpolated data sample, said real counter to forward to said fractional interpolator said value of 'r/Llin', said real counter also designed to operate as said read logic,
wherein said real counter is designed to:
initialize r/Llin to zero upon reset of said fractional sampling-rate converter;
increment r/Llin by 1/Llin at said second rate; and
if the incremented value of r/Llin is greater than or equal to 1.0, then set said incremented value to equal (r/Llin−1.0), and cause a next data sample in said FIFO buffer to be transferred to said fractional interpolator, wherein said setting represents an occurrence of a roll-over condition.

20. The PLL of claim 19, wherein said fractional sampling rate converter further comprises a computation engine for computation of the value 1/Llin, said computation engine to provide said value 1/Llin to said real counter,
wherein said computation engine updates said value 1/Llin from time to time to compensate for drifts in frequencies of said high-frequency clock and said low-frequency clock, wherein said real counter applies the updated value of 1/Llin upon occurrence of said roll-over condition, wherein upon occurrence of an overflow condition in said FIFO buffer, logic in said FIFO buffer is designed to replace the last sample in said FIFO buffer by the arithmetic mean of a next input data sample received from said write logic and said last sample, and wherein upon occurrence of an underflow condition, said fractional interpolator is designed to compute a next input data sample Xlo[k−2] to be used in computation of the next interpolated sample according to the Equation:

$$Xlo[k-2]=(2*Xlo[k])-Xlo[k-1],$$

wherein,

Xlo[k] and Xlo[k−1] are the last two samples currently available in said fractional interpolator.

21. The fractional sampling-rate converter of claim 1, wherein said real counter is designed to:

initialize r to zero upon reset of said fractional sampling-rate converter;

increment r by one at said second rate based on active edges of an intermediate frequency clock having a rate equal to Fhi, wherein said intermediate frequency clock is derived from and synchronous with said high-frequency clock (Fxo); and if the incremented value of r is greater than or equal to Llin, then set r to equal (r−Llin), and cause a next data sample in said FIFO buffer to be transferred to said fractional interpolator.

* * * * *